United States Patent
Guerinoni et al.

(10) Patent No.: US 12,325,628 B2
(45) Date of Patent: Jun. 10, 2025

(54) MICROELECTROMECHANICAL DEVICE WITH OUT-OF-PLANE STOPPER STRUCTURE

(71) Applicant: STMICROELECTRONICS S.r.l., Agrate Brianza (IT)

(72) Inventors: Luca Guerinoni, Bergamo (IT); Patrick Fedeli, Senago (IT); Luca Giuseppe Falorni, Limbiate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 491 days.

(21) Appl. No.: 17/744,310

(22) Filed: May 13, 2022

(65) Prior Publication Data

US 2022/0380202 A1 Dec. 1, 2022

(30) Foreign Application Priority Data

May 25, 2021 (IT) .......... 102021000013523

(51) Int. Cl.
  *B81B 3/00* (2006.01)
  *B81B 7/02* (2006.01)
(52) U.S. Cl.
  CPC .......... *B81B 7/02* (2013.01); *B81B 3/0051* (2013.01); *B81C 2203/0109* (2013.01)
(58) Field of Classification Search
  CPC .......... B81B 7/02; B81B 7/04; B81B 3/0051; B81B 2201/0235; H01H 3/60; G01P 2015/0871
  See application file for complete search history.

(56) References Cited

U.S. PATENT DOCUMENTS

| | | | |
|---|---|---|---|
| 6,230,564 B1 | 5/2001 | Matsunaga et al. | |
| 8,354,900 B2 | 1/2013 | Cazzaniga et al. | |
| 9,206,032 B1 | 12/2015 | Kang et al. | |
| 9,604,840 B1 * | 3/2017 | Cheng | B81C 1/00238 |
| 9,695,039 B1 * | 7/2017 | Liu | B81B 3/0051 |
| 10,011,476 B1 | 7/2018 | Hsu et al. | |
| 2009/0194397 A1 | 8/2009 | Merassi et al. | |
| 2014/0260613 A1 | 9/2014 | Qiu et al. | |
| 2016/0094156 A1 * | 3/2016 | Thompson | B81B 3/0051 |
| | | | 438/51 |
| 2021/0363000 A1 | 11/2021 | Allegato et al. | |

* cited by examiner

*Primary Examiner* — Walter H Swanson
*Assistant Examiner* — Jacob T Nelson
(74) *Attorney, Agent, or Firm* — Seed IP Law Group LLP

(57) ABSTRACT

A microelectromechanical device includes a substrate, a first structural layer, and a second structural layer of semiconductor material. A sensing mass extends in the first structural layer and is coupled to the substrate by first elastic connections to enable oscillation of the sensing mass in a sensing direction perpendicular to the substrate by a maximum amount relative to a resting position of the sensing mass. An out-of-plane stopper structure includes an anchorage fixed to the substrate and a mechanical end-of-travel structure, which extends in the second structural layer, faces the sensing mass, and is separated therefrom by a gap having a width smaller than the maximum displacement distance of the sensing mass. The mechanical end-of-travel structure is coupled to the anchorage by second elastic connections that enable movement of the mechanical end-of-travel structure in the sensing direction in response to an impact of the sensing mass.

20 Claims, 7 Drawing Sheets

MICROELECTROMECHANICAL DEVICE WITH OUT-OF-PLANE STOPPER STRUCTURE

BACKGROUND

Technical Field

The present disclosure relates to a microelectromechanical (MEMS) device with out-of-plane stopper structures in particular a movement sensor with control/sensing of a capacitive type, and to a process for manufacturing a microelectromechanical device.

Description of the Related Art

As is known, in order to increase the mechanical strength of microelectromechanical devices, in particular of inertial devices, stopper structures are frequently used, which limit the oscillations of the mobile structures. Stopper structures limit the free path of the mobile structures and prevent damage that might derive in the event of impact, for example due to high-speed impact or to overextension of the elastic connections. Of course, stopper structures must be designed in an appropriate way to prevent concentrations of forces and be able to absorb the impact, without undergoing or causing damage. Production of out-of-plane stopper structures may, however, prove not altogether effective.

BRIEF SUMMARY

Specifically, the MEMS device considered comprises two structural layers stacked on a substrate and forming at least one structure that is mobile out of the plane of one of the structural layers (the so-called out-of-plane mobile structure) and an out-of-plane stopper structure in the other structural layer. The mobile structure may, for example, form part of a motion sensor along a Z-axis or in a Z direction and be equipped with a mobile mass formed in one of the structural layers, which oscillates in a sensing direction perpendicular to the plane of the structural layers and is capacitively coupled to fixed electrodes formed on the substrate.

In particular, in the ensuing description, reference will be made to a MEMS movement sensor and to the problems regarding its manufacture; however, the present disclosure may be applied in general to other types of MEMS devices.

For instance, the MEMS device may comprise one or more of the following structures, either single or coupled together (combo): accelerometer, gyroscope, geophone, inclinometer, and resonator. Moreover, the MEMS device may constitute a MEMS actuator.

Micromechanical devices of this type find wide use in consumer, automotive, and industrial applications.

In one or more embodiments of the present disclose, a microelectromechanical device and a process for manufacturing a microelectromechanical device enable the limitations with conventional MEMS devices described above to be overcome or at least reduced.

The present disclosure is directed to a microelectromechanical device that includes a substrate, a first structural layer on the substrate, and a second structural layer on the first structural layer. A sensing mass is in the first structural layer. A plurality of first elastic connections are coupled to the sensing mass and to the substrate. The sensing mass having a maximum displacement distance in a sensing direction perpendicular to the substrate via the plurality of first elastic connections. An anchor is coupled to the substrate. A limit plate is in the second structural layer facing the sensing mass. A gap is between the sensing mass and the limit plate, the gap having a width less than the maximum displacement distance of the sensing mass. There is at least one second elastic connection coupled to the limit plate and to the anchor.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
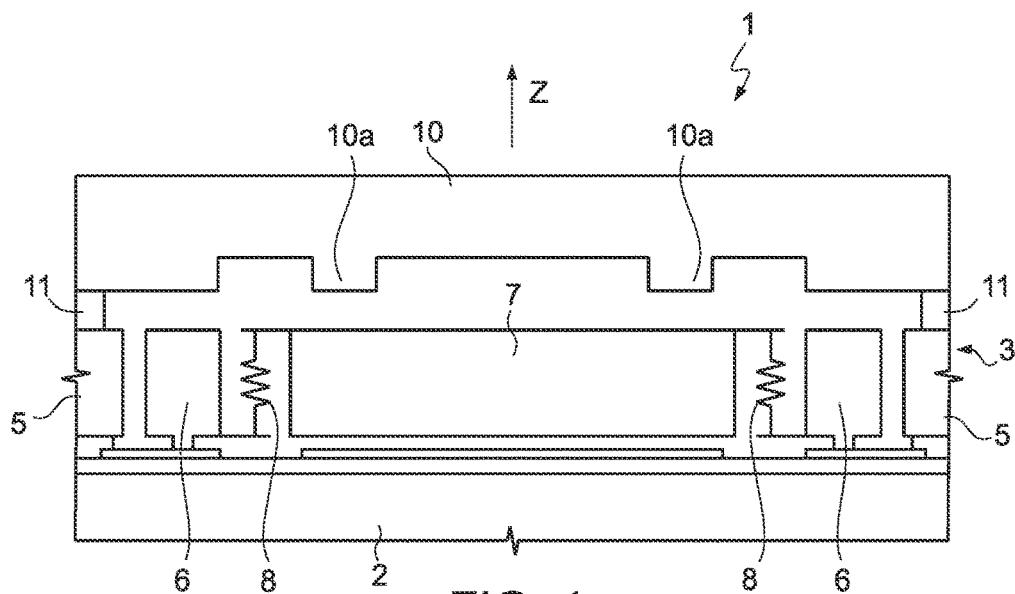
FIG. 1 is a cross-sectional view through a known microelectromechanical device.

For instance, FIG. 1 illustrates a known microelectromechanical device 1, in particular an accelerometer Z. The microelectromechanical device 1 comprises a substrate 2, an epitaxial layer 3, obtained from which are an external supporting structure 5, anchorages 6, a mobile mass 7, and elastic connections 8 configured to enable oscillations of the mobile mass 7 in a sensing direction Z perpendicular to the substrate 2 and to a plane of the epitaxial layer 3.

A cap 10 is joined to the supporting structure 5 by an adhesion layer 11, normally a glass-frit layer. The cap 10 is shaped so as to form stopper structures 10a, which limit the oscillations of the mobile mass 7 in the sensing direction.

The solution described is not, however, without limitations, which depend mainly upon the thickness of the adhesion layer 11. Given that the thickness of the adhesion layer 11 cannot be reduced beyond a certain limit, in fact, also the width of the gap between the mobile mass 7 and the stopper structures 10a may not always have the desired value. The effectiveness of the out-of-plane stopper structures 10a may therefore not be optimal. On the other hand, the useful oscillation of the mobile mass 7 is much smaller than the width of the gap between the mobile mass 7 and the stopper structures 10a, and consequently there are no advantages in terms of signal if this width is oversized. Furthermore, the cap 10 that incorporates the stopper structures 10a presents a considerable stiffness, and the capacity for dissipating energy may not be sufficient to prevent damage to the mobile mass 7 with conventional MEMS designs.

Figure 2:
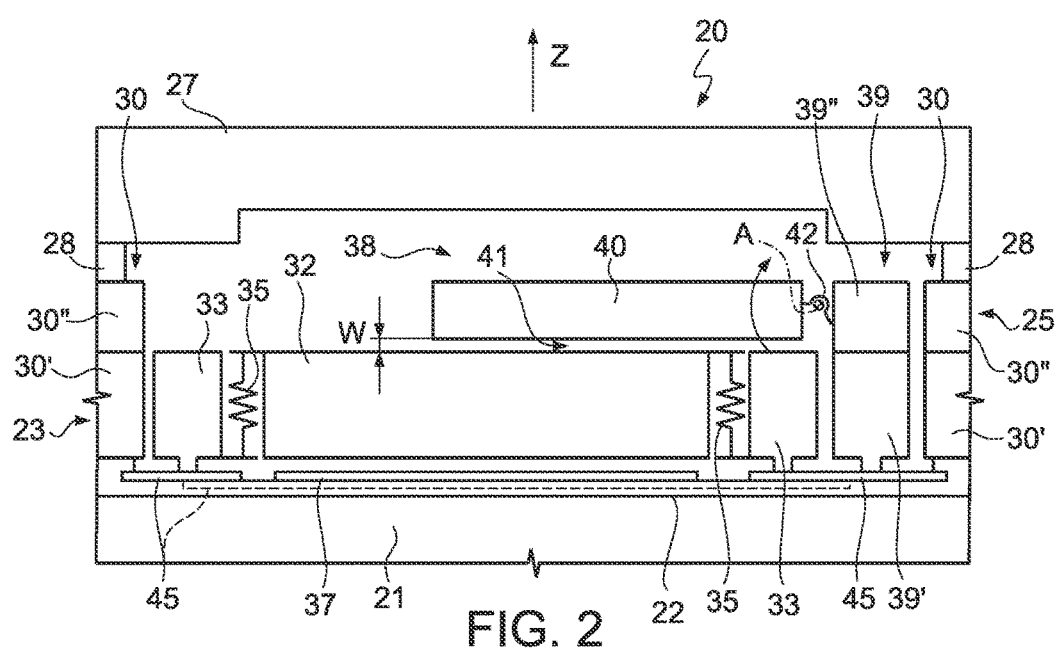
FIG. 2 is a cross-sectional view through a microelectromechanical device according to an embodiment of the present disclosure.

With reference to FIG. 2, a microelectromechanical device according to an embodiment of the present disclosure is illustrated schematically and designated by the number 20. In the example illustrated, in particular, the microelectromechanical device 20 is a Z-axis accelerometer. It is understood, however, that the disclosure is not limited to this type of device and applies to any microelectromechanical device with out-of-the-plane movements, including, in particular, sensors of a differential type for out-of-plane movement, gyroscopes with movements of pitch and roll, and multiaxial gyroscopes and accelerometers.

The microelectromechanical device 20 comprises a substrate 21, coated with an insulating layer 22, a first structural layer 23, a second structural layer 25, and a cap 27, joined to the second structural layer 25 through an adhesion layer 28, for example a glass-frit layer.

The first structural layer 23 and the second structural layer 25 are made of semiconductor material, for example, respectively, a first epitaxial layer and a second epitaxial layer grown in succession on the substrate 21 and on the insulating layer 22, as explained in greater detail hereinafter. Consequently, the first structural layer 23 is interposed between the substrate 21 and the second structural layer 25.

Components of the microelectromechanical device 20 are obtained from the first structural layer 23 and/or from the second structural layer 25.

In particular, an external supporting frame 30 extends along the perimeter of the microelectromechanical device 20 and comprises respective portions 30', 30" of the first structural layer 23 and of the second structural layer 25. The portions 30', 30" correspond to outer portions or outer ends of the first and second structural layers 23, 25 facing anchorages 33, as shown in FIG. 2. In one or more embodiments, the portions 30', 30" are the remaining portion of the first and second structural layers 23, 25 that define an outer perimeter of the MEMS device 20 after formation of the various components described in more detail below, with the portions 30', 30" separated from anchorages 33 by a space or gap. The cap 27 is joined to the supporting frame 30 by the adhesion layer 28.

A sensing mass 32 extends in, or is formed in, the first structural layer 23 and is supported and connected to the substrate 21 by the anchorages 33 (which may also be referred to as mass anchors 33 or first anchors 33) and first elastic connections 35. Also the anchorages 33 and the first elastic connections 35 are formed by, or formed in, the first structural layer 23. The first elastic connections 35 are configured to enable the sensing mass 32 to oscillate a maximum distance (which may also be referred to herein as a maximum displacement distance) in a sensing direction Z perpendicular to the substrate 21 and to a horizontal plane through the first structural layer 23 and of the second structural layer 25. The plurality of first elastic connections 35 have a maximum elongation in an extended position (which may also be referred to herein as a maximum length or a maximum displacement) and a minimum elongation or length in a resting position (i.e., in the absence of rotations and/or external forces applied). The maximum elongation of the first elastic connections 35 may be selected according to design factors and corresponds to a maximum amount of deformation or extension of the first elastic connections 35 before failure of the first elastic connections 35 (e.g., elastic failure, irreversible deformation, ductile failure, cracking, or fracture, among other potential failure modes of the first elastic connections 35). The maximum elongation of the first elastic connections 35 corresponds to a maximum oscillation distance or range of travel of the sensing mass 32 in an embodiment. A sensing electrode 37 arranged on the insulating layer 22 faces, and is capacitively coupled to, the sensing mass 32.

Figure 3:
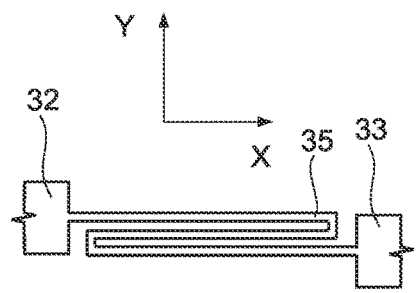
FIG. 3 is a top plan view of a detail of anchorages and an elastic connection of the microelectromechanical device of FIG. 2.
Figure 4:
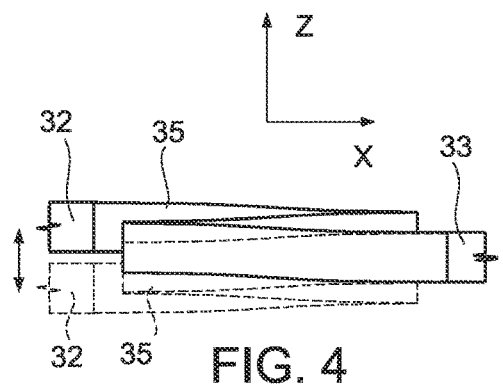
FIG. 4 is a front elevational view of the detail of FIG. 3.

The elastic connections 35 are for simplicity represented in FIG. 2 as linear springs in the direction Z, but may be formed as flexible beam elements from portions of the first structural layer 23, as shown purely by way of example in FIGS. 3 and 4. In particular, FIG. 3 is a top plan view of a representative connection between one of the first elastic connection elements 35, one of the anchorages 33, and the sensing mass 32 in an X-Y plane. FIG. 4 is a front elevational view of the detail of FIG. 3. In operation, and with reference to FIG. 3 and FIG. 4, the sensing mass 32 and the first election connection elements 35 may deflect along the Z-axis. The maximum oscillation or range of travel of the sensing mass 32 is represented by the difference in position of the sensing mass 32 between the dashed and solid lines. Similarly, the maximum elongation of the first elastic connection elements 35 is represented in FIG. 4 by the position of the connection elements 35 in dashed or solid lines. In other words, the maximum elongation of the first elastic connection elements 35 in either direction along the Z-axis corresponds to the dashed and solid representations of the connection elements 35 in FIG. 4.

An out-of-plane stopper structure 38 (which may also be referred to herein as an out-of-plane stopper assembly 38 or a stopper assembly 38) extends both in the first structural layer 23 and in the second structural layer 25 and comprises an anchorage 39 (which may also be referred to herein as a stopper anchor 39 or a second anchor 39) fixed to the substrate 21 and a mechanical end-of-travel structure 40 (which may also be referred to herein as a limit plate 40 or a plate 40). More precisely, the anchorage 39 is adjacent to the anchorage 33 of the sensing mass 32 in a lateral direction (i.e., left to right in the orientation of FIG. 2) and in turn comprises portions 39', 39" of the first structural layer 23 and of the second structural layer 25, respectively, which are set on top of one another.

The mechanical end-of-travel structure 40 is defined by a plate that extends in the second structural layer 25, at least in part faces the sensing mass 32, and is separated from the sensing mass 32 by a gap 41 having a width W smaller than the maximum elongation of the first elastic connections 35 and the maximum oscillation distance or range of travel of the sensing mass 32 from the resting position in the Z direction. In one non-limiting example, the maximum oscillation distance of the sensing mass 32 in the Z direction, and therefore the maximum elongation of the first elastic connections 35 in the Z direction, may be 10 micrometers (μm). Accordingly, the width W would be less than 10 μm. The present disclosure contemplates additional values for the maximum oscillation distance and maximum elongation with the above being merely one non-limiting example. The maximum oscillation distance and the maximum elongation may be less than 1 μm, less than 5 μm, 10 μm, 20 μm, 30 μm, 40 µm, 50 µm, 60 µm, 70 µm, 80 µm, 90 µm, or 100 or more µm, inclusive of all intervening values to the second decimal place (i.e., the above ranges include 31.54 µm and other like intervening values between the stated integers). The mechanical end-of-travel structure 40 is coupled to the anchorage 39 by second elastic connections 42 configured to enable displacements of the mechanical end-of-travel structure 40 in the sensing direction Z in response to an impact of the sensing mass 32.

Figure 5:
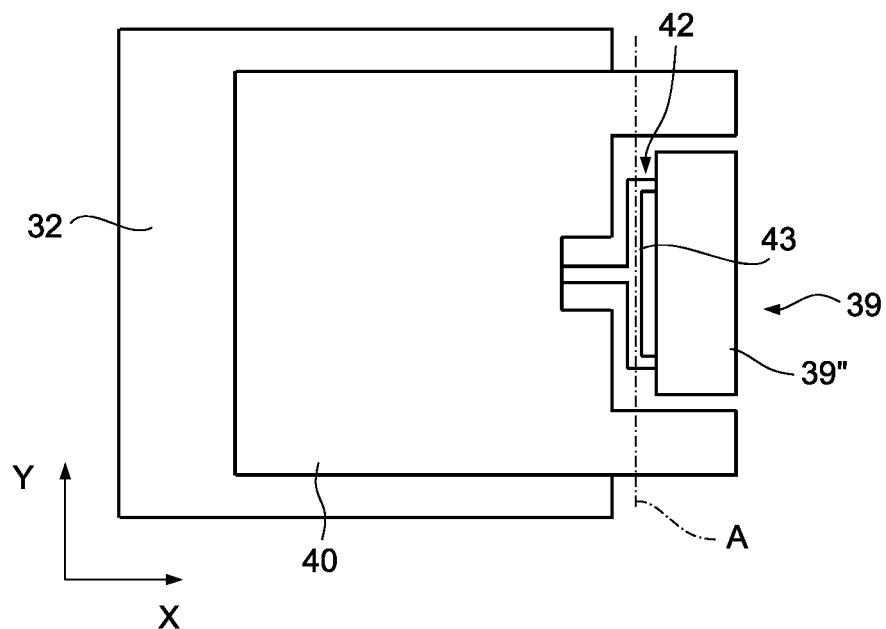
FIG. 5 is a simplified top plan view of the microelectromechanical device of FIG. 2.

As shown in greater detail in FIG. 5, and with continuing reference to FIG. 2, in one embodiment, the second elastic connections 42 comprise an elastic twisting element 43, which extends along an axis A parallel to the substrate 21 and perpendicular to the sensing direction Z. The elastic twisting element 43 has ends connected to the anchorage 39, in particular to the portion 39" that extends in the second structural layer 25, and a central portion connected to the mechanical end-of-travel structure 40. In this way, in the event of impact of the sensing mass 32 against the mechanical end-of-travel structure 40, the mechanical end-of-travel structure 40 rotates about the axis A. Rotation about the axis A, which is an off-center axis and not centroidal relative to the MEMS device 20 generally, in one embodiment, results in a displacement with respect to the sensing axis Z (variation of position in height) of the portion of the mechanical end-of-travel structure 40 that faces the sensing mass 32. The energy of the impact is consequently in part converted into energy of strain of the second elastic connections 42 and/or kinetic energy of the mechanical end-of-travel structure 40, thus reducing the risk of microcracks in the sensing mass 32 and in the mechanical end-of-travel structure 40 itself.

Turning back to FIG. 2, the microelectromechanical device 20 further comprises a voltage-balancing structure 45, configured to prevent voltage differences between the sensing mass 32 and the mechanical end-of-travel structure 40. In particular, the voltage-balancing structure 45 comprises a conductive line that contacts both the sensing mass 32 and the mechanical end-of-travel structure 40. For convenience, the conductive line is illustrated as a dashed line in FIG. 2. More precisely, the voltage-balancing structure 45 extends on the insulating layer 22. The anchorages 33 of the sensing mass 32 and the anchorage 39 of the stopper structure 38 are formed directly on the voltage-balancing structure 45. Equalization of the voltage between the sensing mass 32 and the mechanical end-of-travel structure 40 is obtained by the fact that the anchorages 33 and the first elastic connections 25 on the one hand and the anchorage 39 and the second elastic connections 42 on the other are of doped semiconductor material and form continuous conductive structures.

Figure 6:
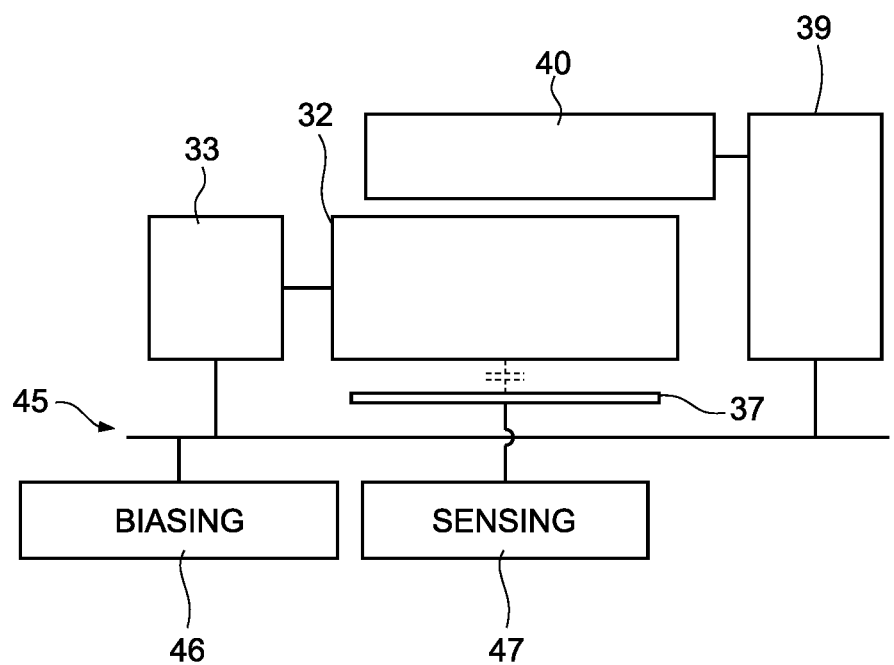
FIG. 6 is an electrical circuit diagram of the microelectromechanical device of FIG. 2.

FIG. 6 shows schematically the voltage-balancing structure 45 and the connections to the sensing mass 32 and to the mechanical end-of-travel structure 40 of FIG. 2. Moreover, illustrated in FIG. 6 are a biasing circuit 46, which applies a desired operative voltage to the sensing mass 32, and a sensing circuit 47, which reads the capacity present between the sensing mass 32 and the sensing electrode 37 according to of the position of the sensing mass 32. The voltage-balancing structure 45 prevents potentially harmful transfer of charge from contact between the sensing mass 32 and the mechanical end-of-travel structure 40.

Figure 7:
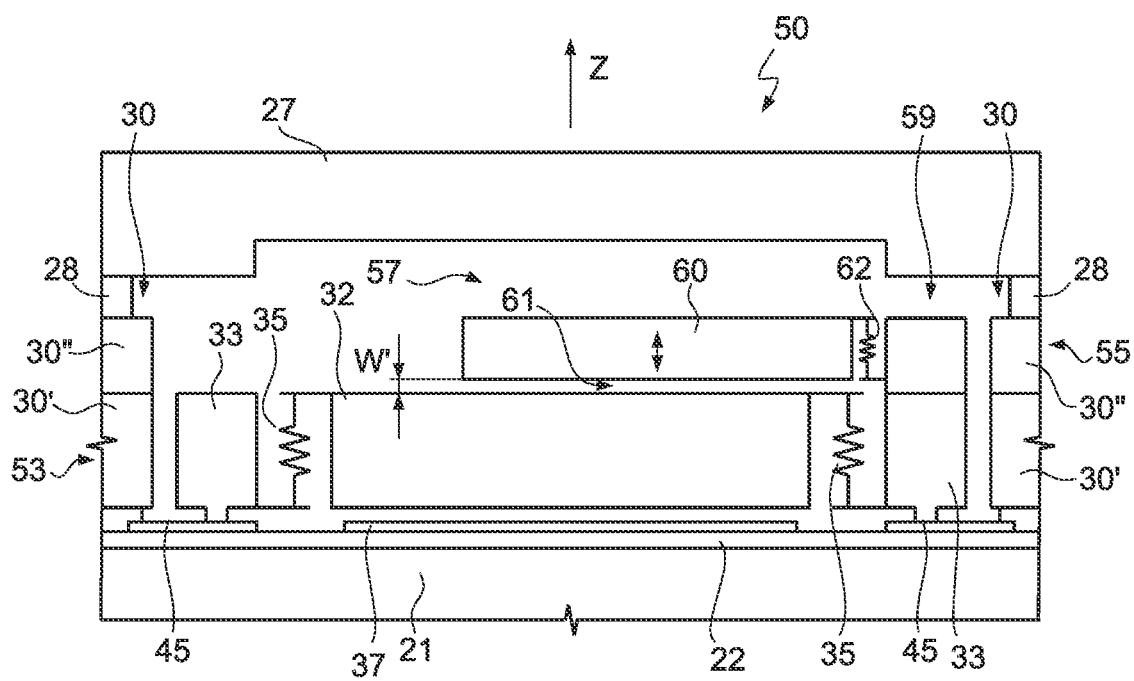
FIG. 7 is a cross-sectional view through a microelectromechanical device according to an embodiment of the present disclosure.
Figure 8:
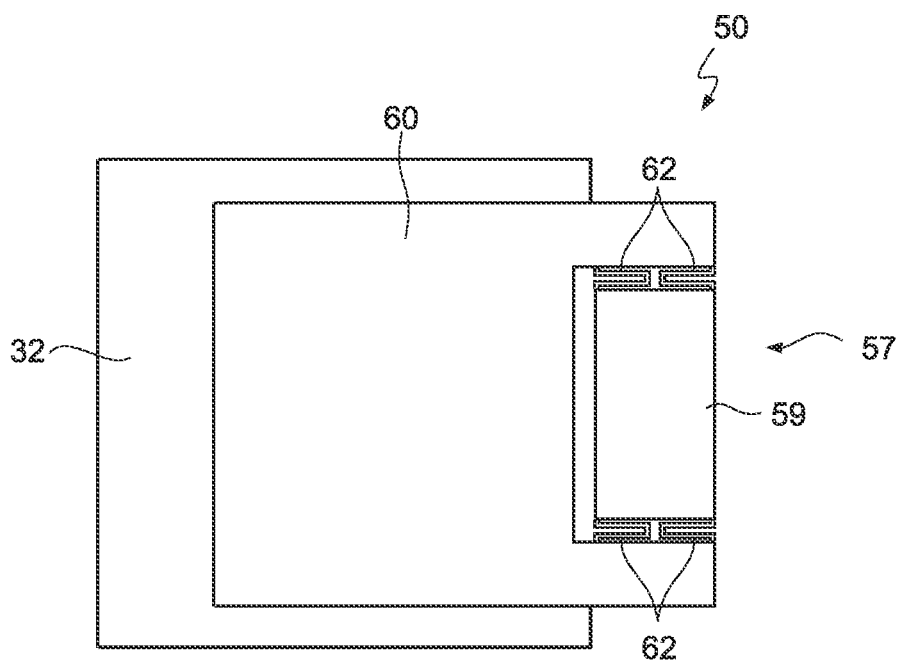
FIG. 8 is a simplified top plan view of the microelectromechanical device of FIG. 7.

FIGS. 7 and 8 illustrate one or more embodiments of a microelectromechanical device 50 according to the disclosure. Except as otherwise indicated below, parts of the device 50 that are the same as parts already illustrated and described herein for device 20 are designated by the same reference numbers. The microelectromechanical device 50 comprises the substrate 21, the insulating layer 22, a first structural layer, and a second structural layer, here designated by 53 and 55 and defined, respectively, by a first epitaxial layer and a second epitaxial layer grown in succession on the substrate 21.

Extending in the first structural layer 53 is the sensing mass 32 with the anchorages 33. As already described, the sensing mass 32 and the anchorages 33 are obtained from the first structural layer 53.

An out-of-plane stopper structure 57 extends in the second structural layer 55 and comprises an anchorage 59 and a mechanical end-of-travel structure 60. More precisely, the anchorage 59 extends in the second structural layer 55 and is fixed to one of the anchorages 33 of the sensing mass 32. A single anchorage is thus obtained in part from the first structural layer 53 (anchorage 33) and in part from the second structural layer 55 (anchorage 59) and has the function of supporting both the sensing mass 32 and the mechanical end-of-travel structure 60. Thus, the anchorage 59 for the stopper structure 57 may form a part of, or be integral with, the anchorage 33 for the sensing mass 32 according to the concepts of the disclosure with the anchorage 59 for the stopper structure 57 arranged in a different layer than the anchorage 33 for the sensing mass 32.

The mechanical end-of-travel structure 60 extends in the second structural layer 55, at least in part faces the sensing mass 32, and is separated from the sensing mass 32 by a gap 61 having a width W' smaller than the maximum elongation of the sensing mass 32 from the resting position. The mechanical end-of-travel structure 60 is coupled to the anchorage 59 by second elastic connections 62 configured to enable the mechanical end-of-travel structure 60 to translate in the sensing direction Z in response to an impact of the sensing mass 32. In a non-limiting embodiment, the second elastic connections 62 comprise flexible beam elements obtained from portions of the second structural layer 55, as shown in FIG. 8 according to one example. The second elastic connections 62 are coupled to the end-of-travel structure 60 at longitudinal ends (i.e., a top and bottom in the orientation of FIG. 8) of the anchorage 59 instead of at lateral sides or ends of the anchorage (i.e., left and right in the orientation of FIG. 8) as with the anchorage 39 in FIG. 5. Further, the second elastic connections 62 may include multiple connections on opposite sides of the anchorage 59 that each connect to the structure 60 instead of two connections from the same side of the anchorage 39 that merge into a single connection to the structure 40 as in FIG. 5. The axis of rotation of the travel structure 60 may pass through a center of the elastic connection elements 62, which is off-center and non-centroidal with respect to the travel structure 60 and the MEMS device 50 generally. In this way, in the event of impact of the sensing mass 32 against the mechanical end-of-travel structure 60, the mechanical end-of-travel structure 60 translates in the sensing direction Z, absorbing part of the energy of the impact and reducing the risk of microcracks in the sensing mass 32 and in the mechanical end-of-travel structure 60 itself.

The microelectromechanical device 50 further comprises the external supporting frame 30 and the cap 27, joined to the supporting frame 30 through the adhesion layer 28.

The microelectromechanical device 20 of FIG. 2 may be obtained using the process described as follows with reference to FIGS. 9-16. As already mentioned, in practice, the sensing mass 32, the anchorages 33 of the sensing mass, and the out-of-plane stopper structure 38 are obtained from two structural layers grown epitaxially on one another, as described in detail hereinafter.

Figure 9:
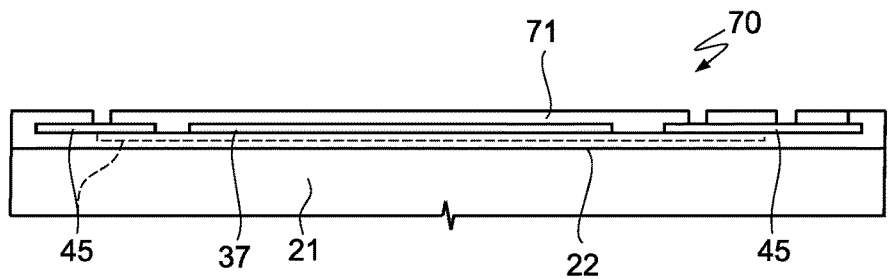
FIGS. 9-15 are cross-sectional views of successive steps of a manufacturing process according to an embodiment of the present disclosure.

With reference to FIG. 9, a wafer 70 of semiconductor material, for example monocrystalline silicon, initially comprises the substrate 21, grown on which is the insulating layer 22, for example of silicon oxide. A conductive layer, not shown entirely, for example of polycrystalline silicon, is deposited on the insulating layer 22 and patterned to provide the sensing electrode 37 and the voltage-balancing structure 45. A first sacrificial layer 71, for example, of silicon oxide grown thermally or deposited, is formed on the first dielectric layer 22 and incorporates the sensing electrode 37 and the voltage-balancing structure 45. The first sacrificial layer 71 is selectively etched in positions corresponding to the anchorages 33 of the sensing mass 32 and to the anchorage 39 of the mechanical end-of-travel structure 40, which will then be formed. The sensing electrode 37 and the voltage-balancing structure 45 remain exposed where the first sacrificial layer 71 has been removed.

Figure 10:
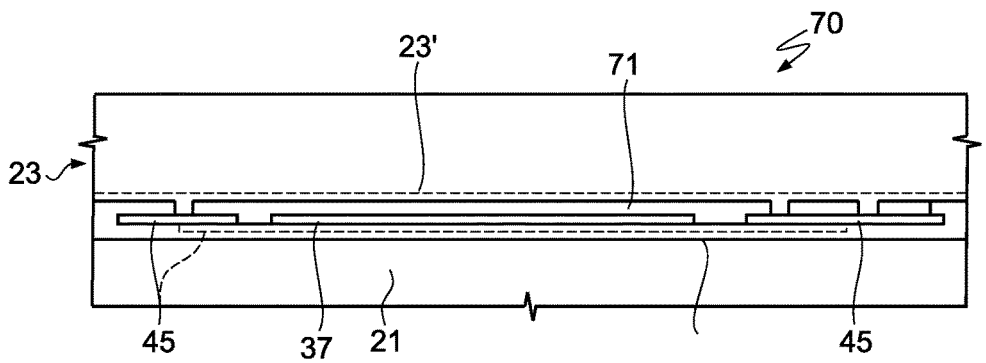

Then in FIG. 10, the first structural layer 23 is grown epitaxially on the first sacrificial layer 71 on the first dielectric layer 22 on the substrate 21 from a deposited seed layer 23' and contacts the sensing electrode 37 and the voltage-balancing structure 45 through the openings in the first sacrificial layer 71. The first structural layer 23 has a thickness that is determined on the basis of the characteristics of the desired microelectromechanical structures and may be comprised, for example, between 2 and 80 μm. After structural growth, the first structural layer 23 is planarized and brought to the desired final thickness, for example by CMP (Chemical Mechanical Polishing).

Figure 11:
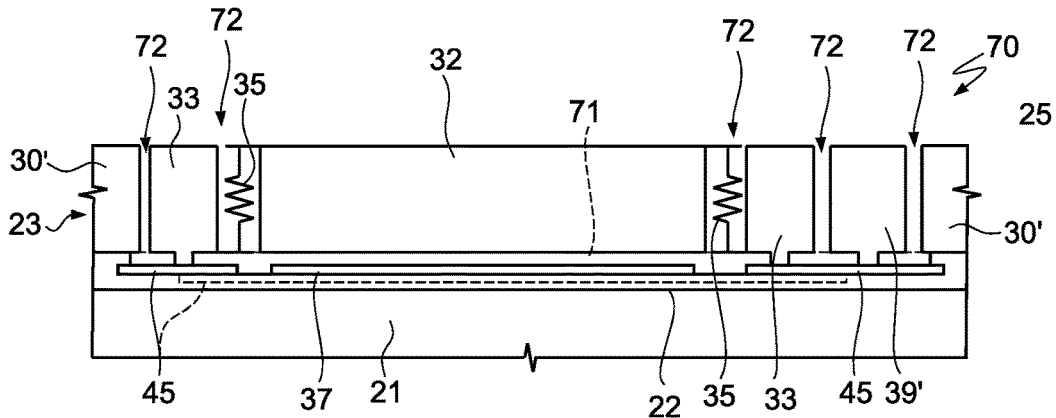

Turning to FIG. 11, the first structural layer 23 is etched to define bottom portions of the desired structures and other regions envisaged and explained in more detail herein. In particular, formed in this step from the first structural layer 23 are the anchorages 33, the sensing mass 32, the first elastic connections 35, first or bottom portions 39' of the anchorages 39, and first or bottom portions 30' of the supporting frame 30. For this purpose, the wafer 70 is coated with a resist mask not shown (first trench mask) and subject to a dry etch, to form trenches 72, which traverse the first structural layer 23 completely. The etch stops automatically on the first sacrificial layer 71 on the first dielectric layer 22 on the substrate 21, which is then removed to release the sensing mass 32 and the first elastic connections 35.

Figure 12:
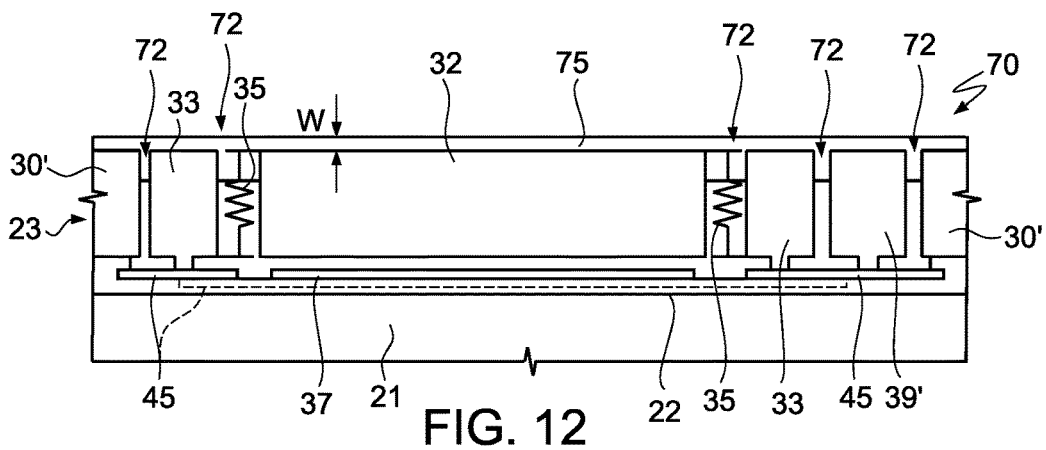

In FIG. 12, a second sacrificial layer 75 is deposited, for example of TEOS (TetraEthyl OrthoSilicate) for a thickness equal to the desired width W of the gap 41 between the sensing mass 32 and the mechanical end-of-travel structure 40. The second sacrificial layer 75 partially fills the trenches 72, for example for a third of their depth, although the depth of the filling may be selected without impacting the concepts of the disclosure. The second sacrificial layer 75 is then planarized.

Figure 13:
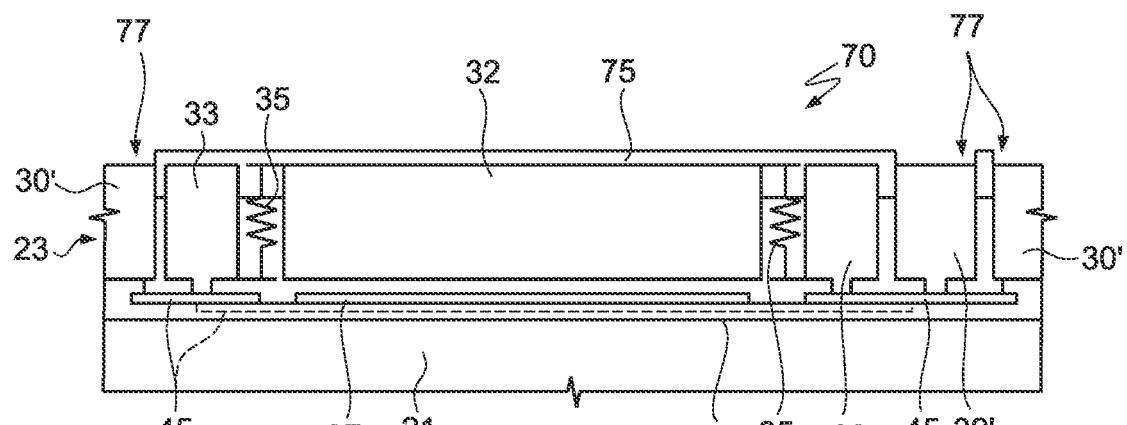

The second sacrificial layer 75 is etched and removed selectively, using a masking layer not shown (second anchorage mask) to form anchorage openings 77, as illustrated in FIG. 13. Etching of the second sacrificial layer 75 terminates on the first structural layer 23. In general, the anchorage openings 77 are provided in the areas where it is desired to form connection regions between the first structural layer 23 and the second structural layer 25 that will be subsequently formed. In particular, here, the anchorage openings 77 are formed in positions corresponding to the supporting frame 30 and to the anchorage 39 of the mechanical end-of-travel structure 40.

Figure 14:
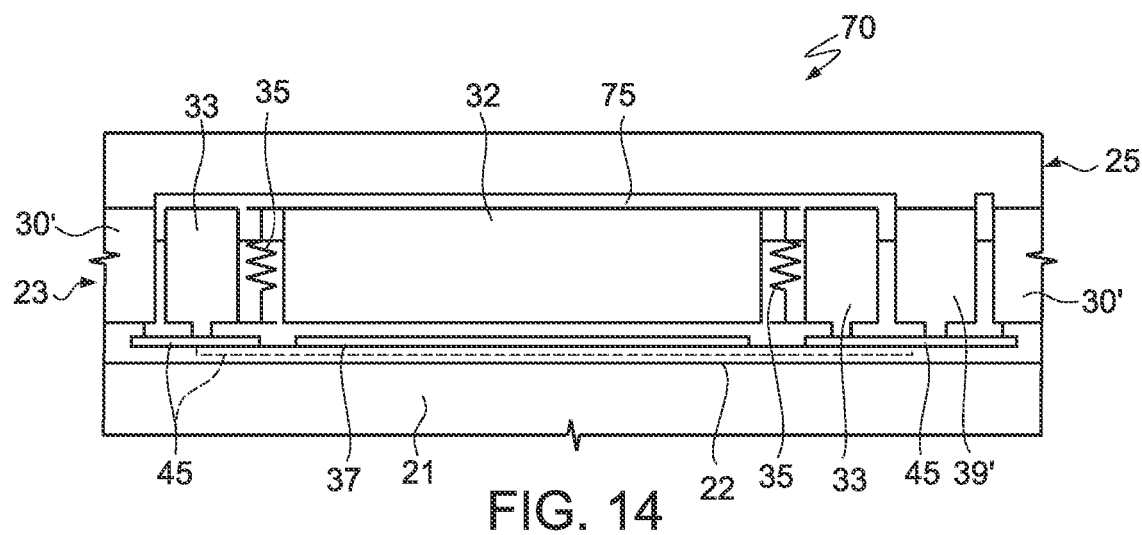

Next, with reference to FIG. 14, the second structural layer 25 is grown, also in this case epitaxially, for a thickness comprised, for example, between 2 and 80 μm. The thickness of the second structural layer 25 is linked to the desired microelectromechanical structures, in particular the structure of the mechanical end-of-travel structure 40 (FIG. 2). In general, the second structural layer 25 may be thinner than the first structural layer 23, even though the opposite may be the case, and the disclosure is not limited to any particular ratio between the thicknesses of the epitaxial layers 23, 25. The thickness of the second structural layer 25 is greater where the second structural layer 25 itself is joined to the first structural layer 23. Elsewhere, the difference is represented by the thickness of the second sacrificial layer 75 and corresponds to the width W (FIG. 2) of the gap 41 to be created between the sensing mass 32 at rest and the mechanical end-of-travel structure 40 (FIG. 2).

After epitaxial growth, the second structural layer 25 is planarized and brought to the desired final thickness, for example by CMP (Chemical Mechanical Polishing).

Figure 15:
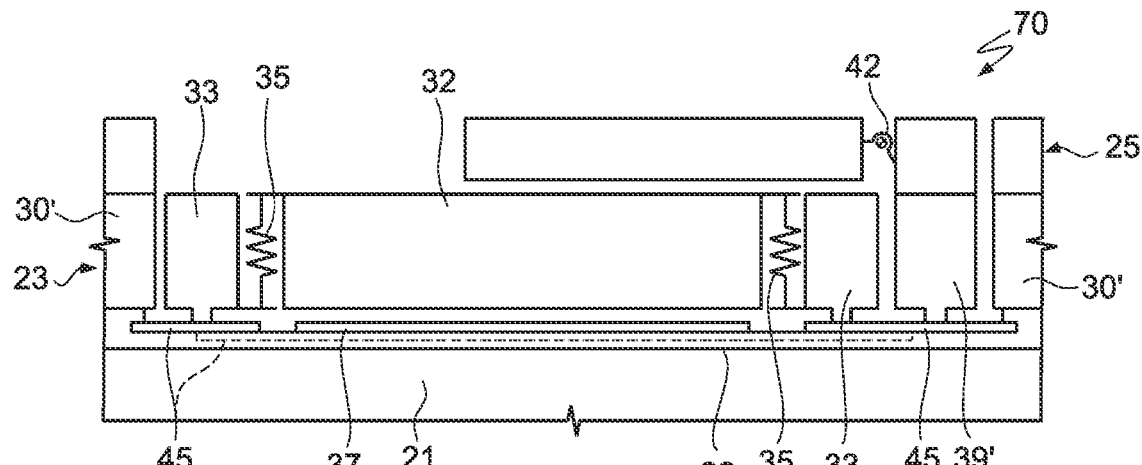

Next, the second structural layer 25 is etched, as shown in FIG. 15. For this purpose, the wafer 70 is coated with a resist mask (not illustrated) and subjected to a dry etch. In this step, the portions of the second structural layer 25 not covered by the resist mask are removed for the entire thickness, and the etch stops on the second sacrificial layer 75.

In particular, defined in this step are the sensing mass 32, the second or top portion 39" (FIG. 2) of the anchorage 39, the second elastic connections 42, and the second or top portion 30" (FIG. 2) of the supporting frame 30.

Then, the residual portions of the second sacrificial layer 75 are removed, thus releasing the mechanical end-of-travel structure 40.

Finally, a cap wafer (cap 27 in FIG. 2) is bonded to the wafer 70 by the adhesion layer 28 (FIG. 2), and the composite wafer thus obtained is diced to form the microelectromechanical device 20 of FIG. 2.

Advantageously, the thickness of the second sacrificial layer 75 may be selected in a flexible way on the basis of the design preferences and may be controlled with high precision. Consequently, also the width W of the gap 41 can be selected and defined precisely according to the design preferences. The width W may be any selected value less than the selected value from the range of values above for the maximum oscillation of the sensing mass 32 or maximum elongation of the first elastic connections 35 according to the concepts of the disclosure.

Figure 16:
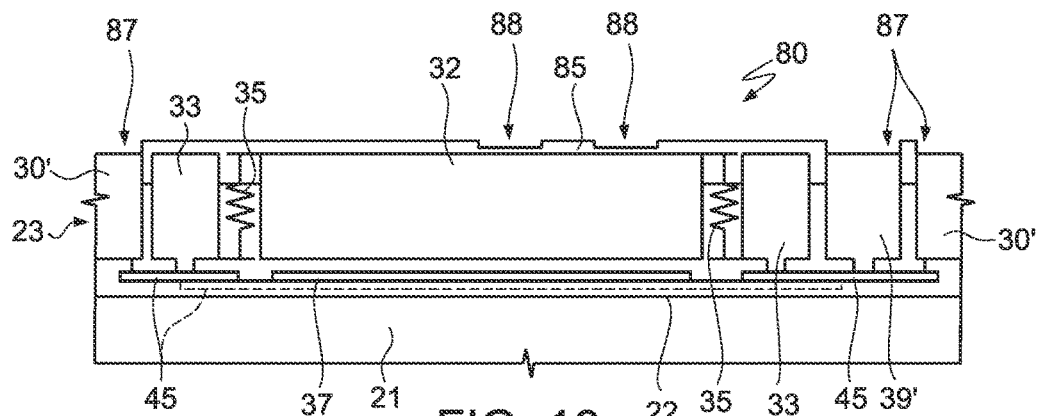
FIG. 16 is a cross-sectional view of an intermediate step of a manufacturing process according to an embodiment of the present disclosure.
Figure 17:
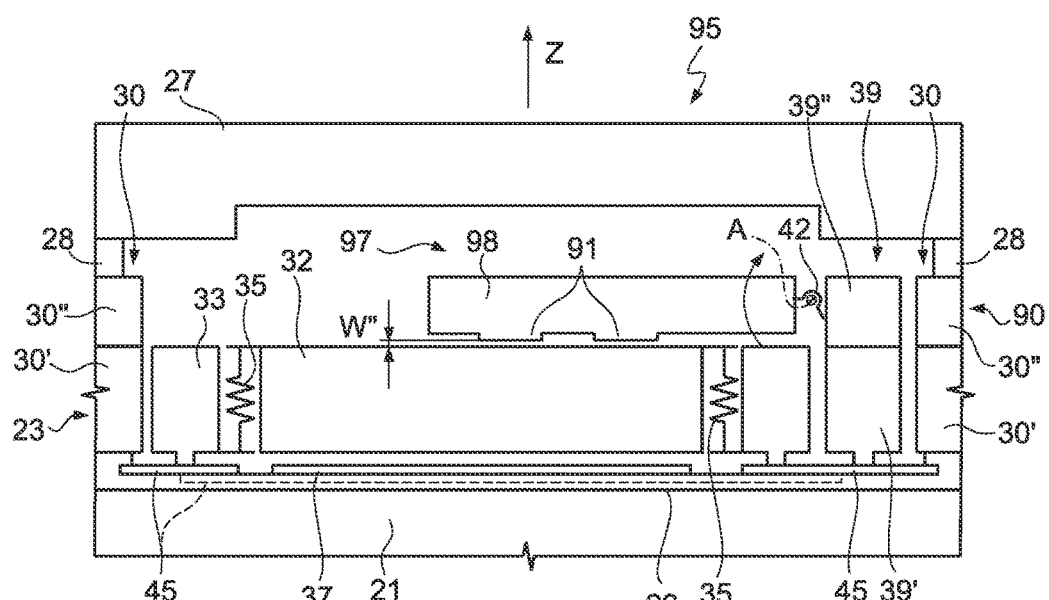
FIG. 17 is a cross-sectional view through a microelectromechanical device according to an embodiment of the present disclosure.

FIGS. 16 and 17 illustrate a variant of the process described and a microelectromechanical device thus obtained according to one or more embodiments.

In a semiconductor wafer 80, initially the processing steps already described with reference to FIGS. 9-13 are carried out up to formation of anchorage openings, here designated by 87, in the second sacrificial layer 85. Prior to the second epitaxial growth, a further mask (not shown) is used for providing recesses 88 on the sensing mass 32, for example by a time-controlled etch.

When the second structural layer is grown, here designated by 90, formed within the recesses 88 are protuberances or teeth 91 that project from the second structural layer 90 towards the sensing mass 32, at a distance W" determined by the depth of the recesses 88. The process proceeds as already described with etching of the second structural layer 90 to define the mechanical end-of-travel structure (connected to which are the teeth 91) and the second elastic connections, removal of the second sacrificial layer 85, bonding of the cap 27, and cutting of the wafer 80 into dice, each of which contains a microelectromechanical device 95. Each microelectromechanical device 95 comprises an out-of-plane stopper structure 97, where the mechanical end-of-travel structure 98 of the stopper assembly 97 is provided with teeth 91.

Figure 18:
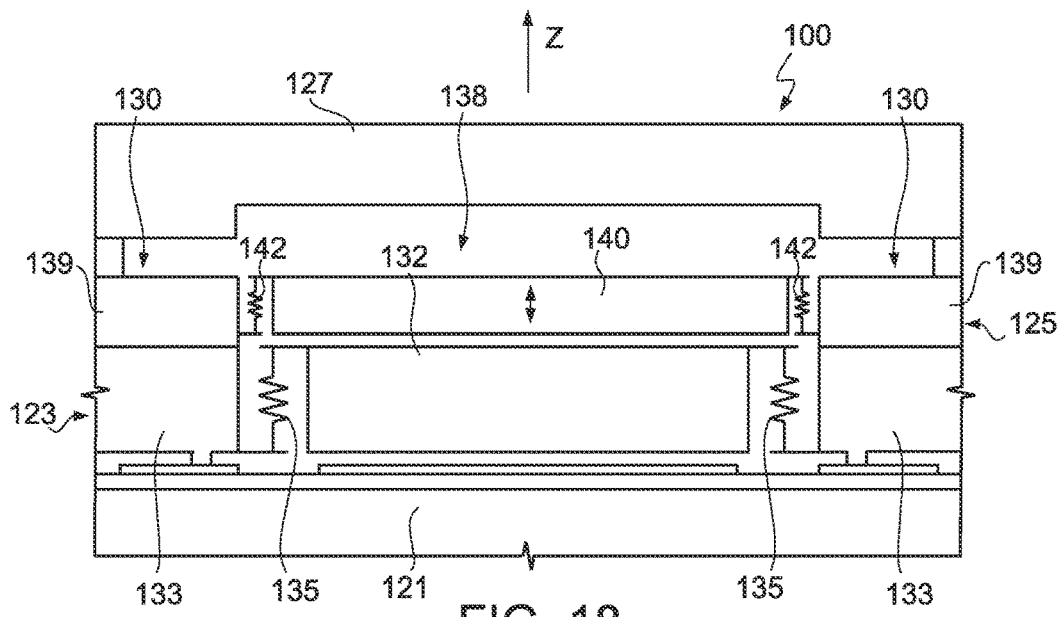
FIG. 18 is a cross-sectional view through a microelectromechanical device according to an embodiment of the present disclosure.

According to an embodiment of the disclosure illustrated in FIG. 18, in a microelectromechanical device 100 a supporting frame 130 for a cap 127 defines anchorages 133 for a sensing mass 132 and anchorages 139 for a mechanical end-of-travel structure 140 of an out-of-plane stopper structure 138. More precisely, the microelectromechanical device 100 comprises a first structural layer 123 and a second structural layer 125 defined, respectively, by a first epitaxial layer grown on a substrate 121 and a second epitaxial layer grown on the first epitaxial layer. Defined in the first structural layer 123 are the sensing mass 132, first elastic connections 135, and the anchorages 133, which also form first or bottom portions of the supporting frame 130. Defined in the second structural layer 125 are the mechanical end-of-travel structure 140, second elastic connections 142, and the anchorages 139, which also form second or top portions of the supporting frame 130. The anchorages 139 are disposed in direct contact with the anchorages 133 without any discontinuity.

Figure 19:
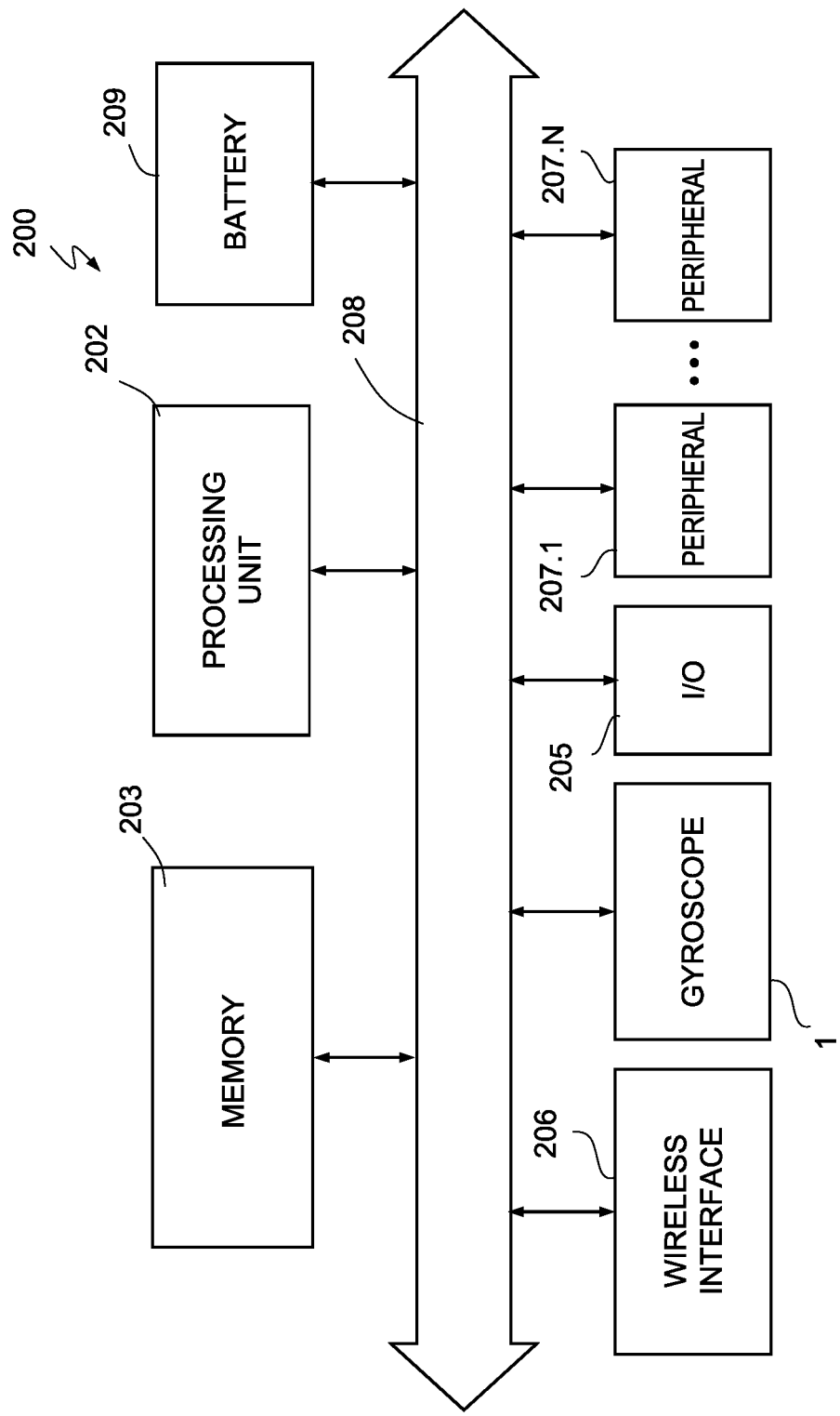
FIG. 19 is a simplified block diagram of an embodiment of an electronic system incorporating a microelectromechanical device according to the present disclosure.

FIG. 19 shows an electronic system 200 that may be of any type, in particular, but not exclusively, a wearable device, such as a watch, a bracelet or a smartband; a computer, such as a mainframe, a personal computer, a laptop or a tablet; a smartphone; a digital music player, a digital camera, or any other device designed to process, store, transmit, or receive information. The electronic system 200 may be a general-purpose processing system or embedded in a device, an apparatus, or some other system.

The electronic system 200 comprises a processing unit 202, memory devices 203, a microelectromechanical device (which may be a gyroscope in a non-limiting example) according to the disclosure, for example the microelectromechanical devices 20, 50, 100 described herein, and may moreover be provided with input/output (I/O) devices 205 (for example, a keyboard, a pointing device, or a touchscreen), a wireless interface 206, peripherals 207.1, . . . , 207.N, and possibly further auxiliary devices, here not shown. The components of the electronic system 200 may be coupled together in communication directly and/or indirectly through a bus 208. The electronic system 200 may further comprise a battery 209. It should be noted that the scope of the present disclosure is not limited to embodiments necessarily having one or all of the components listed.

The processing unit 202 may comprise, for example, one or more microprocessors, microcontrollers, and the like, according to the design preferences.

The memory devices 203 may comprise volatile memory devices and non-volatile memory devices of various kinds, for example SRAMs, and/or DRAMs for volatile memories, and solid-state memories, magnetic disks and/or optical disks for non-volatile memories.

Finally, it is evident that modifications and variations may be made to the microelectromechanical device and to the process described, without thereby departing from the scope of the present disclosure, as defined in the annexed claims.

In the first place, the microelectromechanical device is not limited to a particular type of sensor, transducer, or actuator, but may be any microelectromechanical device that can be integrated in a semiconductor body.

Moreover, further microstructures may be provided in the first and second structural layers for further sensors, transducers, and actuators, in addition to what has been described.

Finally, it is understood that the shape and dimensions of the out-of-plane stopper structure and the configuration of the second elastic connections and of the anchorage of the mechanical end-of-travel structure may be selected on the basis of the design preferences. For instance, the anchorage for the mechanical end-of-travel structure could be defined by the supporting frame, as in the example of FIG. 18, whereas the anchorages for the sensing mass could be provided separately.

In one or more embodiments, a microelectromechanical device may be summarized as including: a substrate of semiconductor material; a first structural layer of semiconductor material on the substrate; a second structural layer of semiconductor material on the first structural layer, the second structural layer of semiconductor material including a sensing mass extending in the first structural layer and coupled to the substrate by first elastic connections, which are configured to enable the sensing mass to oscillate in a sensing direction perpendicular to the substrate, with a maximum elongation with respect to a resting position, and an out-of-plane stopper structure comprising a stopper anchorage fixed to the substrate and a mechanical end-of-travel structure, the mechanical end-of-travel structure extending in the second structural layer, facing the sensing mass, and separated from the sensing mass by a gap having a width smaller than the maximum elongation, and the mechanical end-of-travel structure coupled to the stopper anchorage by second elastic connections configured to enable displacements of the mechanical end-of-travel structure with respect to the sensing direction in response to an impact of the sensing mass.

The device may further include: a voltage-balancing structure, configured to prevent voltage differences between the sensing mass and the mechanical end-of-travel structure; the voltage-balancing structure including a conductive line electrically coupled both to the sensing mass and to the mechanical end-of-travel structure; the stopper anchorage extending in the second structural layer; the stopper anchorage extending also in the first structural layer; the displacements of the mechanical end-of-travel structure including rotations about an axis perpendicular to the sensing direction; the displacements of the mechanical end-of-travel structure include shifts in the sensing direction; a supporting frame fixed to the substrate and surrounding the sensing mass and the out-of-plane stopper structure, and a protective cap joined to the supporting frame and covering the mechanical end-of-travel structure; the supporting frame extending in part in the first structural layer and in part in the second structural layer; the stopper anchorage incorporated in the supporting frame; the mechanical end-of-travel structure including protuberances projecting towards the sensing mass.

One or more embodiments of an electronic system may be summarized as including a processing unit and a microelectromechanical device according to concepts of the disclosure coupled to the processing unit.

One or more embodiments of a process for manufacturing a microelectromechanical device may be summarized as including: forming a first structural layer of semiconductor material on a substrate of semiconductor material; forming a second structural layer of semiconductor material on the first structural layer, including defining, in the first structural layer, a sensing mass and first elastic connections, which connect the sensing mass to the substrate and are configured to enable the sensing mass to oscillate in a sensing direction perpendicular to the substrate, with a maximum elongation with respect to a resting position, and forming an out-of-plane stopper structure comprising a stopper anchorage fixed to the substrate and a mechanical end-of-travel structure, wherein forming an out-of-plane stopper structure includes defining the mechanical end-of-travel structure in the second structural layer in a position facing the sensing mass and separated from the sensing mass by a gap having a width smaller than the maximum elongation, and defining second elastic connections, connecting the mechanical end-of-travel structure to the stopper anchorage and configured to enable displacements of the mechanical end-of-travel structure with respect to the sensing direction in response to an impact of the sensing mass.

The process may further include: forming the first structural layer of semiconductor material includes epitaxially growing the first structural layer on the substrate and forming the second structural layer of semiconductor material includes epitaxially growing the second structural layer on the first structural layer; electrically connecting together the sensing mass and the mechanical end-of-travel structure; and connecting including forming conductive lines on the substrate and forming a sensing anchorage for the sensing mass and the stopper anchorage in contact with the conductive lines.

One or more embodiments of a microelectromechanical device may be summarized as including: a substrate; a sensing mass; a first elastic connection coupled to the sensing mass and to the substrate, the sensing mass having a maximum displacement distance via the first elastic connection; a limit plate; a second elastic connection coupled to the limit plate and to the substrate; and a gap between the sensing mass and the limit plate, the gap having a width less than the maximum displacement distance of the sensing mass.

The microelectromechanical device may further include: a first structural layer on the substrate, the first elastic connection being in the first structural layer, and a second structural layer on the first structural layer, the second elastic connection being in the second structural layer; the sensing mass being in the first structural layer and the limit plate being in the second structural layer; a first anchor in the first structural layer, the first elastic connection coupled to the sensing mass and to the first anchor, and a second anchor having a first portion in the first structural layer and a second portion in the second structural layer, the second elastic connection coupled to the limit plate and to the second portion of the second anchor; a first anchor on the substrate, the first elastic connection coupled to the sensing mass and to the first anchor, and a second anchor disposed on the first anchor, the second elastic connection coupled to the limit plate and to the second anchor.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device, comprising:
    a substrate;
    a first structural layer on the substrate;
    a second structural layer on the first structural layer;
    a sensing mass in the first structural layer;
    a plurality of first elastic connections coupled to the sensing mass and to the substrate, the sensing mass having a maximum displacement distance in a sensing direction perpendicular to the substrate via the plurality of first elastic connections;
    an anchor coupled to the substrate;
    a limit plate in the second structural layer facing the sensing mass;
    a gap between the sensing mass and the limit plate, the gap having a width less than the maximum displacement distance of the sensing mass; and
    at least one second elastic connection coupled to the limit plate and to the anchor.

2. The microelectromechanical device according to claim 1, further comprising:
    an insulating layer on the substrate;
    a voltage-balancing structure on the insulating layer, the anchor in direct contact with the voltage-balancing structure.

3. The microelectromechanical device according to claim 2 wherein the voltage-balancing structure includes a conductive line electrically coupled to the sensing mass and to the limit plate.

4. The microelectromechanical device according to claim 1 wherein the anchor is in the second structural layer.

5. The microelectromechanical device according to claim 4 wherein the anchor is in the first structural layer.

6. The microelectromechanical device according to claim 1 wherein, during operation, the limit plate rotates about an axis perpendicular to the sensing direction of the sensing mass via the at least one second elastic connection.

7. The microelectromechanical device according to claim 1 wherein, during operation, the limit plate moves in the sensing direction of the sensing mass via the at least one second elastic connection.

8. The microelectromechanical device according to claim 1, further comprising:
    a support frame coupled to the substrate and surrounding the sensing mass, the anchor, and the limit plate; and
    a protective cap coupled to the support frame and disposed over the limit plate.

9. The microelectromechanical device according to claim 8 wherein the support frame is in both the first structural layer and the second structural layer.

10. The microelectromechanical device according to claim 8 wherein the anchor is part of the support frame.

11. The microelectromechanical device according to claim 1 wherein the limit plate includes protuberances extending towards the sensing mass.

12. A process for manufacturing a microelectromechanical device, comprising:
    forming a first structural layer on a substrate;
    forming a second structural layer on the first structural layer;
    forming, in the first structural layer, a sensing mass and first elastic connections coupling the sensing mass to the substrate, the first elastic connections enabling the sensing mass to oscillate a maximum oscillation distance in a sensing direction perpendicular to the substrate;

forming a stopper assembly including forming a stopper anchor coupled to the substrate and a limit plate, forming the stopper assembly further including:
    forming the limit plate in the second structural layer in a position facing the sensing mass and spaced from the sensing mass by a gap having a width smaller than the maximum oscillation distance of the sensing mass; and
    forming second elastic connections connecting the limit plate to the stopper anchor, the second elastic connections enabling displacements of the limit plate with respect to the sensing direction in response to an impact of the sensing mass.

13. The process according to claim 12 wherein forming the first structural layer includes epitaxially growing the first structural layer on the substrate and wherein forming the second structural layer includes epitaxially growing the second structural layer on the first structural layer.

14. The process according to claim 12, further comprising:
    electrically connecting the sensing mass and the limit plate.

15. The process according to claim 14 wherein electrically connecting the sensing mass and the limit plate includes forming conductive lines on the substrate, forming a sensing anchor on the substrate coupled to the sensing mass, and forming the stopper anchor in contact with the conductive lines.

16. A microelectromechanical device, comprising:
    a substrate;
    a sensing mass;
    a first elastic connection coupled to the sensing mass and to the substrate, the sensing mass having a maximum displacement distance via the first elastic connection;
    a limit plate;
    a second elastic connection coupled to the limit plate and to a first anchor on the substrate; and
    a gap between the sensing mass and the limit plate, the gap having a width less than the maximum displacement distance of the sensing mass.

17. The microelectromechanical device according to claim 16, further comprising:
    a first structural layer on the substrate, the first elastic connection being in the first structural layer; and
    a second structural layer on the first structural layer, the second elastic connection being in the second structural layer.

18. The microelectromechanical device according to claim 17 wherein the sensing mass is in the first structural layer and the limit plate is in the second structural layer.

19. The microelectromechanical device according to claim 17, further comprising:
    a second anchor in the first structural layer, the first elastic connection coupled to the sensing mass and to the second anchor,
    wherein the first anchor having has a first portion in the first structural layer and a second portion in the second structural layer, the second elastic connection coupled to the limit plate and to the second portion of the first anchor.

20. The microelectromechanical device according to claim 16, further comprising:
    a second anchor on the substrate, the first elastic connection coupled to the sensing mass and to the second anchor,
    wherein the first anchor is disposed on the second anchor, the second elastic connection coupled to the limit plate and to the first anchor.

* * * * *

UNITED STATES PATENT AND TRADEMARK OFFICE
CERTIFICATE OF CORRECTION

PATENT NO. : 12,325,628 B2
APPLICATION NO. : 17/744310
DATED : June 10, 2025
INVENTOR(S) : Luca Guerinoni et al.

Page 1 of 1

It is certified that error appears in the above-identified patent and that said Letters Patent is hereby corrected as shown below:

In the Claims

Column 14, Claim 19, Line 21:
"anchor having has a first" should read: --anchor has a first--.

Signed and Sealed this
Twenty-sixth Day of August, 2025

Coke Morgan Stewart
*Acting Director of the United States Patent and Trademark Office*